(12) United States Patent
Ridder et al.

(10) Patent No.: US 10,263,586 B2
(45) Date of Patent: Apr. 16, 2019

(54) FILTER ARRANGEMENT FOR FILTERING PARASITIC INDUCTION CURRENTS, AND VOLTAGE CONVERTER COMPRISING A FILTER ARRANGEMENT

(71) Applicant: Conti Temic microelectronic GmbH, Nuremberg (DE)

(72) Inventors: Matthias Ridder, Eckental (DE); Adam Umerski, Nuremberg (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 11 days.

(21) Appl. No.: 15/326,792

(22) PCT Filed: Jun. 9, 2015

(86) PCT No.: PCT/EP2015/062806
§ 371 (c)(1),
(2) Date: Jan. 17, 2017

(87) PCT Pub. No.: WO2016/008646
PCT Pub. Date: Jan. 21, 2016

(65) Prior Publication Data
US 2017/0214377 A1    Jul. 27, 2017

(30) Foreign Application Priority Data

Jul. 18, 2014  (DE) .................. 10 2014 214 021

(51) Int. Cl.
*H03H 7/01*  (2006.01)
*H03H 1/00*  (2006.01)
(Continued)

(52) U.S. Cl.
CPC ............ *H03H 1/0007* (2013.01); *H03H 1/00* (2013.01); *H03H 7/17* (2013.01); *H05K 1/181* (2013.01);
(Continued)

(58) Field of Classification Search
CPC ........ H03H 1/0007; H03H 7/17; H05K 1/181; H05K 5/0247; H05K 2201/10015
(Continued)

(56) References Cited

U.S. PATENT DOCUMENTS

| 5,838,216 A | 11/1998 | White et al. ................... 333/182 |
| 6,218,913 B1 | 4/2001 | Pagenkopf ..................... 333/181 |

(Continued)

FOREIGN PATENT DOCUMENTS

| EP | 2911295 A1 | 8/2015 | ............... H03H 1/00 |
| WO | 2014/122095 A1 | 8/2014 | ............... H03H 1/00 |
| WO | 2016/008646 A1 | 1/2016 | ............... H03H 1/00 |

OTHER PUBLICATIONS

German Office Action, Application No. 102014214021.8, 5 pages, dated Feb. 25, 2015.
(Continued)

*Primary Examiner* — Benny T Lee
*Assistant Examiner* — Hafizur Rahman
(74) *Attorney, Agent, or Firm* — Slayden Grubert Beard PLLC

(57) ABSTRACT

A filter arrangement for filtering parasitic induction currents may include an electrically conductive housing part that at least partly surrounds a cavity, an electric ground connection on the housing part for establishing an electric connection to an electric ground, a busbar in the cavity, and at least one electric filter component electrically connected between the busbar and the housing part and mechanically secured to the
(Continued)

housing part and to the busbar. A voltage converter may include at least one such filter arrangement.

10 Claims, 1 Drawing Sheet

(51) Int. Cl.
*H05K 1/18* (2006.01)
*H05K 5/02* (2006.01)

(52) U.S. Cl.
CPC ..... *H05K 5/0247* (2013.01); *H03H 2001/005* (2013.01); *H03H 2001/0021* (2013.01); *H03H 2001/0042* (2013.01); *H03H 2001/0057* (2013.01); *H05K 2201/10015* (2013.01)

(58) Field of Classification Search
USPC ........................................................ 333/181
See application file for complete search history.

(56) References Cited

U.S. PATENT DOCUMENTS

| 2012/0081097 | A1  | 4/2012  | Birnbach ..................... 323/304 |
| 2013/0154766 | A1  | 6/2013  | Beck et al. ................... 333/182 |
| 2015/0372655 | A1  | 12/2015 | Beck ............................. 333/185 |
| 2016/0100510 | A1* | 4/2016  | Nassler ............... H05K 9/0037 |
|              |     |         | 310/72 |

OTHER PUBLICATIONS

International Search Report and Written Opinion, Application No. PCT/EP2015/062806, 27 pages, dated Sep. 30, 2015.
German Office Action, Application No. 102014214021.8, 4 pages, dated Aug. 26, 2016.

* cited by examiner

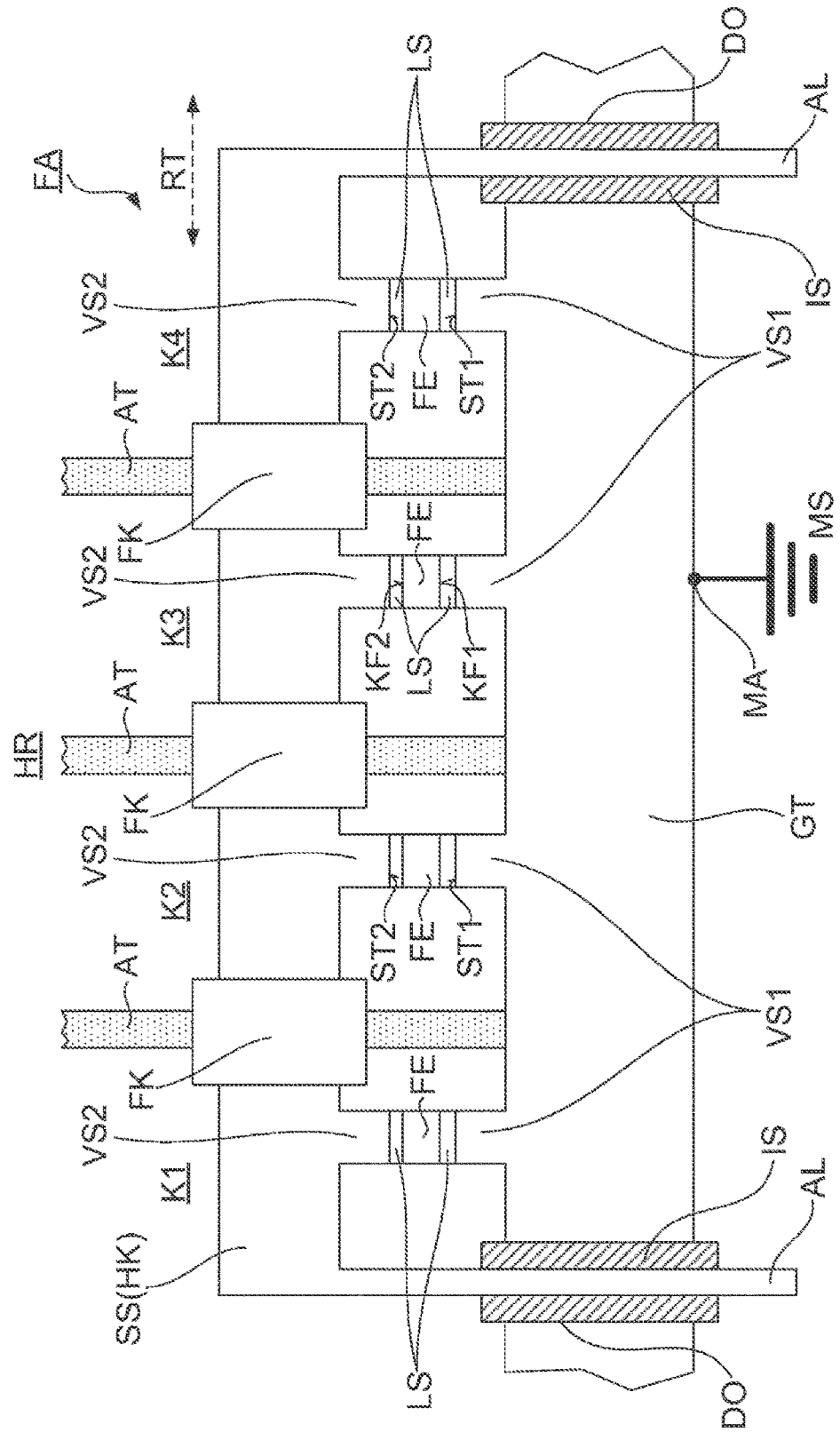

FILTER ARRANGEMENT FOR FILTERING PARASITIC INDUCTION CURRENTS, AND VOLTAGE CONVERTER COMPRISING A FILTER ARRANGEMENT

CROSS-REFERENCE TO RELATED APPLICATIONS

This application is a U.S. National Stage Application of International Application No. PCT/EP2015/062806 filed Jun. 9, 2015, which designates the United States of America, and claims priority to DE Application No. 10 2014 214 021.8 filed Jul. 18, 2014, the contents of which are hereby incorporated by reference in their entirety.

TECHNICAL FIELD

The present invention relates to a filter arrangement for the filtering of parasitic induction currents. The invention also relates to a current converter having at least one such filter arrangement.

BACKGROUND

Current converters, in particular voltage converters, are often used in the power electronics sector, in particular in on-board electrical systems of motor vehicles, in which high currents are switched in very short times between different current paths. The fast switching of the high currents generates parasitic induction currents and consequently electromagnetic emissions, which can lead to malfunctions in the current converters and in other circuit components situated in the vicinity of the current converters. In on-board electrical systems of motor vehicles, such electromagnetic emissions can lead to failure of the on-board electrical systems, and even to immobilization of the vehicles.

To prevent such malfunctions caused by the conduction-based and electromagnetic emissions, it is necessary for parasitic induction currents that arise in the current converters to be filtered in good time before they can cause damage.

SUMMARY

One embodiment provides a filter arrangement for filtering parasitic induction currents, which filter arrangement has the following features: an electrically conductive housing part which at least partially encloses a cavity, an electrical ground connection on the housing part for forming an electrical connection to electrical ground, a busbar in the cavity, and at least one electrical filter element which is electrically connected between the busbar and the housing part and which is mechanically fastened to the housing part and to the busbar.

In one embodiment, the filter further includes at least one separating wall composed of electrically conductive material, which separating wall divides the cavity into at least two chambers, wherein the at least one separating wall is connected in electrically conductive fashion to the electrical ground connection and electromagnetically insulates the at least two chambers with respect to one another.

In one embodiment, the at least one filter element is in the form of a capacitor, in particular a ceramic capacitor.

In one embodiment, the at least one filter element is fastened, as an SMD element, to a printed circuit board and is connected in electrically conductive fashion to the housing part by way of the printed circuit board.

In one embodiment, the at least one filter element is in the form of an SMD element with a first electrical base contact surface and with a second electrical base contact surface, and is a really and mechanically connected, in electrically conductive and directly adjoining fashion, by way of the first base contact surface to the housing part and by way of the second base contact surface to the busbar.

In one embodiment, the housing part has at least one projection which projects toward the busbar and by way of which the at least one filter element is mechanically connected in electrically conductive fashion to the housing part, and/or the busbar has at least one projection which projects toward the housing part and by way of which the at least one filter element is a really and mechanically connected, in electrically conductive and directly adjoining fashion, to the busbar.

In one embodiment, the filter arrangement further includes at least one ferrite body which engages around the busbar.

In one embodiment, the at least one ferrite body has an air gap and is mounted by way of said air gap on the busbar.

In one embodiment, the filter arrangement comprises at least two filter elements and/or at least two ferrite bodies, wherein the filter elements and the ferrite bodies are arranged so as to alternate with one another in the direction of the busbar.

In one embodiment, the ferrite bodies are arranged in each case at the height of the respective separating walls as viewed in the direction of the busbar.

In one embodiment, in each case one separating wall, in each case one ferrite body and sections of the busbar which adjoin the respective separating wall and the respective ferrite body together form in each case one filter stage for the filtering of high-frequency electromagnetic interference.

Another embodiment provides a voltage converter which comprises at least one power element and at least one filter arrangement as disclosed above, wherein the busbar of the filter arrangement is connected in electrically conductive fashion to the power element.

BRIEF DESCRIPTION OF THE DRAWINGS

An example embodiment of the invention is discussed in detail below with reference to the sole FIGURE, FIG. 1, which shows a section of an example filter arrangement of an example voltage converter of an electric vehicle.

DETAILED DESCRIPTION

Embodiments of the present invention provide a means for effectively filtering the parasitic induction currents that arise in current converters, in particular in voltage converters.

In one embodiment, a filter arrangement for filtering parasitic induction currents is provided. The filter arrangement comprises an electrically conductive housing part which at least partially encloses a cavity. On the housing part, the filter arrangement has an electrical ground connection which is designed for forming an electrical connection between the housing part and the electrical ground. The filter arrangement furthermore comprises a busbar which is arranged in the cavity. Furthermore, the filter arrangement comprises at least one electrical filter element which is electrically connected between the busbar and the housing part and which is mechanically fastened to the housing part and to the busbar.

Embodiments of the invention are based on the concept that the parasitic induction currents form high-frequency current components in useful currents, which high-frequency current components can be separated from the useful currents, and rendered harmless, by way of a filter arrangement.

In the context of the invention, it has been identified that high impedances in a filter arrangement constitute a disruptive factor which impairs the filter characteristic of the filter arrangement.

With this realization, it has been sought in the context of the invention to find a solution with which the impedances in the filter arrangement can be reduced to a minimum.

Here, it has been identified that the impedance of a filter element can be reduced considerably by way of an arrangement of the filter element directly between a current-conducting line through which the useful current with the parasitic induction current component flows and electrical ground.

Thus, a filter arrangement has been realized in which the filter element is arranged directly between the busbar, which conducts the useful current, and the housing part and is directly electrically connected to the busbar and to the housing part, wherein the housing part is in turn directly electrically connected, by way of an electrical ground connection formed on the housing part, to the electrical ground.

The direct electrical connection of the filter element between the busbar and the housing part which is electrically connected directly to the electrical ground makes it possible to realize a very short current flow path from the busbar via the filter element to the electrical ground, whereby the impedance of the busbar with respect to the electrical ground can be reduced to a minimum.

Here, the word "directly" means that the electrical connection from the housing part to the electrical ground is realized directly, without other circuit components or other housing parts, by way of only one solid mechanical and electrical connection. Ideally, the base of the cavity in which the filter arrangement is arranged is formed by a solid metal body which is connected with low electrical impedance to the reference potential, in particular ground potential, of the vehicle (chassis).

Owing to the low impedance, the parasitic inductivity in the filter arrangement is reduced to a minimum, whereby in turn, the filter characteristic of the filter arrangement has been considerably improved.

Thus, a filter arrangement is created by way of which the parasitic induction currents in the current converters or the voltage converters can be filtered in an effective manner.

The busbar and the housing part furthermore function as an electromagnetic shield for the filter element.

The filter arrangement preferably furthermore comprises at least one separating wall composed of electrically conductive material, which separating wall divides the cavity into at least two chambers and electromagnetically insulates the at least two chambers with respect to one another. Here, the separating walls are connected in electrically conductive fashion, with low impedance, to the electrical ground connection.

The at least one filter element is preferably in the form of a capacitor, in particular a ceramic capacitor.

The at least one filter element is preferably in the form of an SMD element (a surface-mounted element). Here, the at least one filter element has a first base contact surface and a second base contact surface which are designed for forming electrical contacts. The at least one filter element is connected in electrically conductive and mechanically directly adjoining and areal fashion by way of the first contact surface to the housing part and by way of the second contact surface to the busbar.

The first and the second base contact surface are two electrically conductive contact surfaces of low resistance and large areal extent, which are formed on two mutually opposite surfaces of the filter element and, analogously to the body-side and rear-side contact of a bare chip, are provided for the electrical connection of the filter element to other components.

Here, the expression "directly adjoining" means that the electrical and mechanical connections are realized directly merely by way of a solid screw connection, a soldered/welded connection or a similar cohesive connection, and the filter element adjoins the busbar and the housing part respectively merely by way of said cohesive connection.

The word "areal" means that the electrical and mechanical connections are formed by way of contact surfaces of large extent between the filter element and the busbar or between the filter element and the housing part respectively, which contact surfaces extend over the respective base contact surfaces of the filter element.

Alternatively, the at least one filter element is fastened, as a surface-mounted element, to a printed circuit board. By way of said printed circuit board, the at least one filter element is connected in electrically conductive fashion to the housing part.

The housing part preferably has at least one projection which projects toward the busbar and by way of which the at least one filter element is mechanically connected in electrically conductive fashion to the housing part. Alternatively or in addition to the at least one projection on the housing part, the busbar has at least one projection which projects toward the housing part and by way of which the at least one filter element is also mechanically connected in electrically conductive fashion to the busbar.

The filter arrangement preferably furthermore comprises at least one ferrite body which engages around the busbar.

The at least one ferrite body preferably has an air gap. The at least one ferrite body is preferably mounted or fitted in a simple manner onto the busbar by way of said air gap. In particular, the at least one ferrite body is of U-shaped form.

The filter arrangement preferably comprises at least two filter elements and/or at least two ferrite bodies. Here, the filter elements and the ferrite bodies are arranged so as to alternate with one another in the direction of the busbar.

Thus, the filter elements and the ferrite bodies together form a low-pass filter with a π-topology. Furthermore, in this way, high-frequency current components are dissipated by the housing part to the electrical ground.

The busbar may have a rectangular cross section as viewed in the direction of the busbar.

The ferrite bodies are preferably arranged in each case at the height of the respective separating walls as viewed in the direction of the busbar.

Here, in each case one separating wall, in each case one ferrite body which is situated at the height of the corresponding separating wall as viewed in the direction of the busbar, and sections of the busbar which adjoin the respective separating wall and the respective ferrite body, preferably together form in each case one filter stage which filters high-frequency electromagnetic interference.

Other embodiments provide a current converter comprising at least one power element and at least one above-described filter arrangement, wherein the busbar of the at least one filter arrangement is connected in electrically conductive fashion to the at least one power element.

Advantageous embodiments of the filter arrangement described above are also to be regarded, where otherwise transferable to the current converter mentioned above, as advantageous embodiments of the current converter.

FIG. 1 shows a section of an example filter arrangement FA of an example voltage converter of an electric vehicle.

The filter arrangement FA may comprise a housing part GT which is composed predominantly of an electrically conductive material, for example an aluminum alloy, and which in particular forms the housing base of the housing of the filter arrangement FA. The housing part GT has an electrical ground connection MA by way of which the housing part GT is connected in electrically conductive fashion to the electrical ground MS.

The housing part GT has, on a surface facing toward the cavity HR, four projections VS1 which are formed so as to project from the housing part GT into the cavity HR or toward the busbar SS. The housing part GT furthermore has two passage openings DO.

The housing part GT encloses a cavity HR in which a busbar SS is arranged.

The busbar SS comprises a main body HK which substantially, or at least in sections, is of rectilinear and elongate form and has a rectangular cross section as viewed in the direction RT of the busbar SS.

At the two axial ends of the main body HK, the busbar SS has in each case one connection terminal AL, which connection terminals are formed perpendicularly (or obliquely) with respect to the main body HK and are led in each case through one of the two passage openings DO on the housing part GT into the exterior of the housing. Here, one of the two connection terminals AL forms a current input and is connected in electrically conductive fashion to a power switch of the power output stage (not illustrated in the FIGURE) of the voltage converter. Another connection terminal AL analogously forms a current output and is connected in electrically conductive fashion to a downstream electrical circuit which is not illustrated in the FIGURE. Thus, the filter arrangement FA serves for filtering parasitic induction currents which arise as a result of high-frequency switching of the power switch in the power output stage and which are damaging to the downstream electrical circuit.

In the respective passage opening DO, the filter arrangement FA has in each case an insulation layer IS which encases the respective connection terminal AL extending through the passage opening DO and thus electrically insulates said connection terminal, and the busbar SS, with respect to the housing part GT (the insulation layer IS is illustrated with hatching in the FIGURE).

The busbar SS furthermore has four projections VS2 which are formed so as to project from the main body HK toward the housing part GT. Here, the four projections VS2 on the busbar SS are in each case arranged so as to be paired with and situated opposite one of the four projections VS1 on the housing part GT.

The filter arrangement FA furthermore comprises three ferrite bodies FK which are arranged between in each case two adjacent projections VS2 of the busbar SS.

Here, the ferrite bodies FK enclose the busbar SS and have in each case an air gap which fully separates the respective ferrite body FK at one or more locations.

By way of said air gap, the respective ferrite bodies are mounted on the busbar SS so as to engage around the busbar SS.

The filter arrangement FA furthermore comprises four filter elements FE which, in this embodiment, are in the form of surface-mounted ceramic capacitors (SMD ceramic capacitors).

Each of the four ceramic capacitors FE comprises a first electrical base contact surface KF1 and a second electrical base contact surface KF2, which are formed on two oppositely situated surfaces of the respective ceramic capacitor FE.

The four ceramic capacitors FE are positioned in each case between a projection VS1 of the housing part GT and a projection VS2, situated opposite said projection VS1, of the busbar SS. Here, the ceramic capacitor FE is mechanically connected in electrically conductive fashion by way of the first base contact surface KF1, via a solder layer LS, to the face side ST1 of the projection VS1 of the housing part GT.

Since the preferred capacitors are SMD components, the filter arrangement FA may also have a printed circuit board as a mechanical support for said components.

Furthermore, the ceramic capacitor FE is mechanically connected in electrically conductive fashion by way of the second base contact surface KF2, via a further solder layer LS, to the face side ST2 of the projection VS2 of the busbar SS.

Thus, the three ferrite bodies FK and the four ceramic capacitors FE together form a low-pass filter, in this case with a $\pi$-topology. A T-topology is also possible.

Owing to the direct electrical and mechanical connection of the ceramic capacitors FE between the busbar SS and the housing part GT and thus the electrical ground MS, a filter arrangement FA with a very low impedance is realized, by way of which the parasitic induction currents which arise in the upstream power switch can be filtered in an efficient manner, such that a malfunction in the downstream electrical circuit owing to the parasitic induction currents can be prevented in an effective manner.

Furthermore, the filter arrangement FA comprises three separating walls AT which divide the cavity HR into four chambers K1, K2, K3 and K4. Here, the separating walls AT are arranged in each case at the height of the respective ferrite bodies FK as viewed in the direction RT of the busbar SS, such that a filter stage with in each case one filter element FE is formed in each of the four chambers K1, K2, K3 and K4.

Here, the separating walls AT comprise solid projections which are integrally formed on the housing part GT, and additionally inserted parts which are composed of electrically conductive material such as aluminum, aluminum alloy, copper, copper alloy or steel alloy, such as for example tinplate, and which are connected with the lowest possible impedance to the housing part GT at the greatest possible number of locations.

The chambers K1, K2, K3 and K4 are electromagnetically shielded with respect to one another by way of the separating walls AT. The electromagnetic waves which propagate from the respective filter elements FE are blocked by the respective separating walls AT and thus do not pass into the adjacent chambers K1, K2, K3 and K4.

The separating walls AT are arranged in each case at the heights of the respective ferrite bodies FK as viewed in the direction RT of the busbar SS, and form, in each case together with in each case one ferrite body FK and sections of the busbar SS which adjoin the respective ferrite bodies FK, in each case one additional filter stage for filtering high-frequency electromagnetic interference in the current flowing through the busbar SS.

What is claimed is:

1. A voltage converter comprising:
a power element; and
a filter arrangement comprising:
an electrically conductive housing part that at least partially defines a boundary;
an electrical ground connection on the housing part, the electrical ground connection configured to form an electrical connection to electrical ground;
a busbar disposed within the boundary; and
a filter element electrically connected between the busbar and the housing part, the filter element mechanically fastened to the housing part and to the busbar;
wherein the busbar of the filter arrangement is connected in an electrically conductive manner to the power element;
the filter element comprises an SMD element having a first electrical base contact surface and a second electrical base contact surface, and
the filter element is mechanically and electrically connected to the housing part via the first base contact surface and connected to the busbar via the second base contact surface.

2. A filter arrangement for filtering parasitic induction currents, wherein the filter arrangement comprises:
an electrically conductive housing part at least partially defining a boundary,
an electrical ground connection on the housing part, the electrical ground connection configured to form an electrical connection to electrical ground,
a busbar disposed within the boundary of the housing part, and
a filter element electrically connected between the busbar and the housing part, the electrical filter element mechanically fastened to the housing part and to the busbar,
wherein the filter element comprises an SMD element having a first electrical base contact surface and a second electrical base contact surface, and
the filter element is mechanically and electrically connected to the housing part via the first base contact surface and connected to the busbar via the second base contact surface.

3. The filter arrangement of claim 1, wherein the filter element comprises a ceramic capacitor.

4. The filter arrangement of claim 1, wherein the SMD element configured for mounting on a printed circuit board.

5. The filter arrangement of claim 2, further comprising a separating wall formed from electrically conductive material,
wherein the separating wall divides the boundary into at least two chambers, and
wherein the separating wall is connected in an electrically conductive manner to the electrical ground connection and electromagnetically insulates the at least two chambers with respect to each other.

6. The filter arrangement of claim 1, wherein:
the housing part has at least one projection that projects toward the busbar and through which the filter element is mechanically connected in an electrically conductive manner to the housing part, or
the busbar has at least one projection that projects toward the housing part and through which each filter element is mechanically connected to the busbar in an electrically conductive and directly adjoining manner.

7. The filter arrangement of claim 1, further comprising a ferrite body engaged around the busbar.

8. The filter arrangement of claim 7, comprising at least one additional filter element and at least one additional ferrite body,
Wherein each of the filter elements is arranged with the respective ferrite body in an alternating manner along a direction of the busbar.

9. The filter arrangement of claim 8, wherein each ferrite body is arranged at a height of a respective separating wall as viewed in the direction of the busbar.

10. The filter arrangement of claim 9, wherein each respective separating wall, associated ferrite body, and associated section of the busbar that adjoins the respective separating wall and the respective filter element collectively form one filter stage for filtering high-frequency electromagnetic interference.

* * * * *